(12) United States Patent
Park

(10) Patent No.: US 8,077,507 B2
(45) Date of Patent: *Dec. 13, 2011

(54) PHASE-CHANGE MEMORY DEVICE

(75) Inventor: Kyoung-Wook Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/029,591

(22) Filed: Feb. 17, 2011

(65) Prior Publication Data

US 2011/0141800 A1    Jun. 16, 2011

Related U.S. Application Data

(63) Continuation of application No. 12/345,396, filed on Dec. 29, 2008, now Pat. No. 7,916,525.

(30) Foreign Application Priority Data

Dec. 12, 2008    (KR) .................. 10-2008-0126411

(51) Int. Cl.
*G11C 11/00*    (2006.01)

(52) U.S. Cl. ............... 365/163; 365/148; 365/189.011; 365/189.05

(58) Field of Classification Search .......... 365/163, 365/148, 189.011, 189.05
See application file for complete search history.

(56) References Cited

U.S. PATENT DOCUMENTS

| | | | | |
|---|---|---|---|---|
| 7,349,245 | B2 * | 3/2008 | Kim et al. | 365/158 |
| 7,499,316 | B2 * | 3/2009 | Choi et al. | 365/163 |
| 7,916,525 | B2 * | 3/2011 | Park | 365/163 |

* cited by examiner

*Primary Examiner* — David Lam
(74) *Attorney, Agent, or Firm* — IP & T Group LLP

(57) ABSTRACT

A phase-change memory device includes a data write control unit configured to generate write control signals according to a data combination of a plurality of input data and output write control codes with a code update period controlled according to an activation period of one of the write control signal, and a data write unit configured to output a program current in response to the write control signals and control a level of the program current according to a code combination of the write control codes.

15 Claims, 6 Drawing Sheets

PHASE-CHANGE MEMORY DEVICE

CROSS-REFERENCE TO RELATED APPLICATIONS

This application is a Continuation of U.S. patent application Ser. No. 12/345,396 filed on Dec. 29, 2008 now U.S. Pat. No. 7,916,525, which claims priority of Korean patent application number 10-2008-0126411 filed on Dec. 12, 2008. The disclosure of each of the foregoing applications is incorporated herein by reference in its entirety.

BACKGROUND OF THE INVENTION

The present invention relates to a semiconductor design technology, and more particularly, to a technology for controlling a program current.

Among various memory devices, a dynamic random access memory (DRAM), used as a computer main memory device, is capable of random access and high integration at a low cost. However, the DRAM has a drawback of being a volatile memory. While a static random access memory (SRAM), used as a cache memory, is capable of random access and is faster than the DRAM in the operating speed, the SRAM has a similar drawback. The SRAM is disadvantageous in terms of cost because it has a memory cell size larger than that of the DRAM. A NAND flash memory, which is a nonvolatile memory, is capable of high integration at a low cost and is advantageous in terms of power consumption. However, the NAND flash memory has a low operating speed because it is incapable of random access.

A phase-change random access memory (PCRAM) device is an example of various memory devices that have developed to overcome the drawbacks of such conventional memory devices. The PCRAM device is capable of random access and high integration at a low cost as a nonvolatile memory. The PCRAM device stores data using a phase changeable material. That is, the PCRAM device is a nonvolatile memory device that uses a phase change of a phase changeable material depending on the temperature conditions, i.e., a resistance change proportional to the phase change.

The phase changeable material has an amorphous state or a crystalline state depending on the temperature conditions. A typical example of the phase changeable material is a chalcogenide alloy, one of which, generally used, is Ge2Sb2Te5 (GST) using germanium (Ge), antimony (Sb), and tellurium (Te). The phase changeable material is generally called GST.

The PCRAM device generates a reversible phase change between the crystalline state and the amorphous state of the phase changeable material GST by using Joule heat generated by applying a specific current or voltage to the phase changeable material GST. The crystalline state of the phase changeable material GST is called a set state in terms of circuit. In the set state, the phase changeable material GST has electrical characteristics like a metal with a low resistance. The amorphous state of the phase changeable material GST is called a reset state in terms of circuit. In the reset state, the phase changeable material GST has a resistance higher than the set state. That is, the PCRAM device stores data on the basis of a resistance change between the crystalline state and the amorphous state, and reads the stored data by detecting a current change through the phase changeable material GST or a voltage change depending on a current change. In general, the set state is defined as having a logic level of '0' and the reset state is defined as having a logic level of '1'. The phase changeable material GST maintains its state even when the power supply is interrupted.

Meanwhile, programming currents are used to make a change between the crystalline state and the amorphous state of the phase changeable material GST. A programming current, that is used to change the phase changeable material GST of a memory cell into the set state, is defined as a set current. A programming current, that is used to change the phase changeable material GST of a memory cell into the reset state, is defined as a reset current.

After the reset current is supplied to heat the phase changeable material GST for a given time at temperatures higher than a melting temperature, the phase changeable material GST cools rapidly and changes into the amorphous state. Also, if the set current is supplied to heat the phase changeable material GST for a given time at temperatures higher than a crystallization temperature and lower than the melting temperature, and then, the phase changeable material GST cools gradually and changes into the crystalline state. Meanwhile, because resistance values can be differentiated according to the crystalline volume or the amorphous volume of the phase changeable material GST, this can be used to construct a multi-level memory cell. In general, the reset current is higher than the set current and is flowed for a short time in comparison with the set current; and the set current is lower than the reset current and is flowed for a long time in comparison with the reset current. That is, the state of the phase changeable material GST is changed by a Joule heat of specific conditions generated by supply of the programming currents.

FIG. 1 is a diagram illustrating a structure of a phase-change memory cell.

Referring to FIG. 1, a phase-change memory cell includes: a phase changeable element GST connected between a bit line BL and a first node NO; and a cell transistor MN1 connected between the first node NO and a ground voltage terminal VSS and controlled by a word line WL.

The above phase-change memory cell operates as follows.

First, an operation for programming data in the phase changeable element GST is as follows.

When the word line WL is activated to a high level to turn on the cell transistor MN1, a current path is formed between the ground voltage terminal VSS and the phase changeable element GST connected to the bit line BL. Thus, when a programming current corresponding to data is supplied to the phase changeable element GST through the bit line BL, the phase changeable element GST changes into a crystalline state or an amorphous state. In general, when programming data having a logic level of '1', a reset current is supplied to change the phase changeable element GST into a reset state; and when programming data having a logic level of '0', a set current is supplied to change the phase changeable element GST into a set state. The reset state, i.e., the amorphous state has a greater resistance value than the set state, i.e., the crystalline state.

Also, an operation for detecting data programmed in the phase changeable element GST is as follows.

When the word line WL is activated to a high level to turn on the cell transistor MN1, a current path is formed between the ground voltage terminal VSS and the phase changeable element GST connected to the bit line BL. Thus, when a given voltage or a given current is applied to the phase changeable element GST through the bit line BL, because the flowing current amount or the voltage drop level of the phase changeable element GST differs depending on the resistance value of the phase changeable element GST, this is used to determine data stored in the phase changeable element GST, that is, to determine the state of the phase changeable element GST.

FIG. 2 is a diagram illustrating another structure of a phase-change memory cell.

Referring to FIG. 2, a phase-change memory cell includes: a cell diode D1 having a cathode connected to a word line WL and an anode connected to a first node NO; and a phase changeable element GST connected between a bit line BL and the first node NO.

The above phase-change memory cell operates as follows.

First, an operation for programming data in the phase changeable element GST is as follows.

When the word line WL is activated to a low level, i.e., a ground voltage level and a given voltage starts to be applied through the bit line BL, the cell diode D1 becomes a forward bias state. Therefore, the cell diode D1 is turned on when the voltage difference between the cathode and the anode of the cell diode D1 becomes greater than a threshold voltage. At this point, a current path is formed between the word line WL and the phase changeable element GST connected to the bit line BL. Thus, when a programming current corresponding to data is supplied to the phase changeable element GST through the bit line BL, the phase changeable element GST changes into a crystalline state or an amorphous state. In general, when programming data having a logic level of '1', a reset current is supplied to change the phase changeable element GST into a reset state; and when programming data having a logic level of '0', a set current is supplied to change the phase changeable element GST into a set state. The reset state, i.e., the amorphous state has a greater resistance value than the set state, i.e., the crystalline state.

Also, an operation for detecting data programmed in the phase changeable element GST is as follows.

When the word line WL is activated to a low level, i.e., a ground voltage level and a given voltage starts to be applied through the bit line BL, the cell diode D1 becomes a forward bias state. Therefore, the cell diode D1 is turned on when the voltage difference between the cathode and the anode of the cell diode D1 becomes greater than the threshold voltage. At this point, a current path is formed between the word line WL and the phase changeable element GST connected to the bit line BL. Thus, when a given voltage or a given current is applied to the phase changeable element GST through the bit line BL, because the flowing current amount or the voltage drop level of the phase changeable element GST differs depending on the resistance value of the phase changeable element GST, this is used to determine data stored in the phase changeable element GST, that is, to determine the state of the phase changeable element GST.

The structure of the phase-change memory cell of FIG. 2, which uses the cell diode D1 instead of the cell transistor, has good programming current supply characteristics because of the diode characteristics and is advantageous for high integration because of its small occupying area. Thus, a cell diode, rather than a cell transistor, is recently used to construct a phase-change memory cell.

Meanwhile, the resistance values can be differentiated according to the crystalline volume or the amorphous volume of the phase changeable material GST as described above, and these characteristics can be used to construct a multi level cell (MLC)-type phase-change memory cell. A phase-change memory device including the MLC-type phase-change memory cell is very high in competitiveness because it can be implemented in a higher integration level than a phase-change memory device including a single level cell (SLC)-type phase-change memory cell. What is therefore required is a circuit for controlling the MLC-type phase-change memory cell.

SUMMARY OF THE INVENTION

Embodiments of the present invention are directed to provide a phase-change memory device that supplies a MLC-type phase-change memory cell with a program current corresponding to a data combination of a plurality of input data.

In accordance with an aspect of the present invention, there is provided a phase-change memory device, which includes a data write control unit configured to generate write control signals according to a data combination of a plurality of input data and output write control codes with a code update period controlled according to an activation period of one of the write control signal, and a data write unit configured to output a program current in response to the write control signals and control a level of the program current according to a code combination of the write control codes.

In supplying a MLC-type phase-change memory cell with a program current for generation of a reversible phase change, the present invention supplies a program current during an activation period of a first write control signal controlled according to a data combination of a plurality of input data. The level of the program current is controlled according to a code combination of write control codes. Thus, the present invention can vary the phase change characteristics of the MLC-type phase-change memory cell, i.e., a change in a resistance value by changing the supply time and level of the program current.

DESCRIPTION OF SPECIFIC EMBODIMENTS

Other objects and advantages of the present invention can be understood by the following description, and become apparent with reference to the embodiments of the present invention.

In general, a logic signal of a circuit has a high level H or a low level L corresponding to a voltage level, which are also represented as '1' and '0', respectively. Also, if necessary, it is defined as having a high impedance (Hi-Z) state additionally. Also, it should be noted that the terms PMOS (P-channel Metal Oxide Semiconductor) and NMOS (N-channel Metal Oxide Semiconductor) used herein denote the types of a MOSFET (Metal Oxide Semiconductor Field-Effect Transistor).

Figure 1:
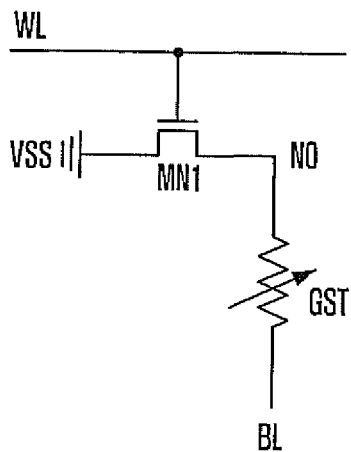
FIG. 1 is a diagram illustrating a structure of a phase-change memory cell.
Figure 2:
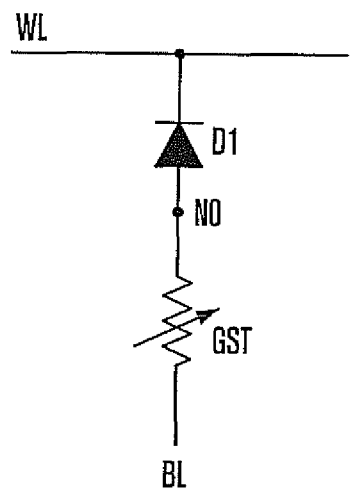
FIG. 2 is a diagram illustrating another structure of a phase-change memory cell.
Figure 3:
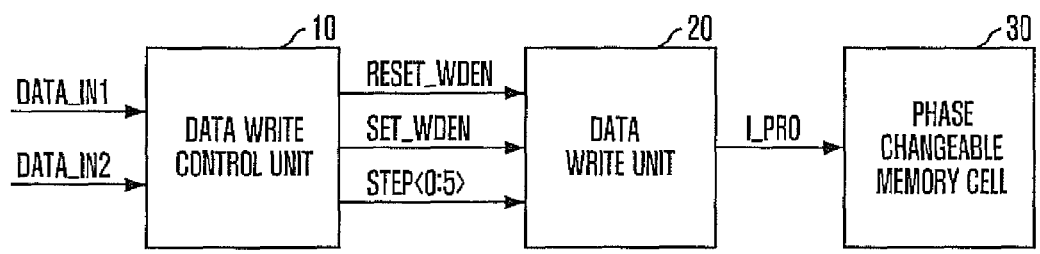
FIG. 3 is a diagram illustrating a structure of a phase-change memory device in accordance with an exemplary embodiment of the present invention.

FIG. 3 is a diagram illustrating a structure of a phase-change memory device in accordance with an exemplary embodiment of the present invention.

As shown, the phase-change memory device includes a data write control unit 10 and a data write unit 20. The data write control unit 10 generates a first write control signal SET_WDEN with an activation period controlled according to a data combination of a plurality of input data DATA_IN1 and DATA_IN2 and a second write control signal RESET_WDEN with a predetermined activation period. The data write control unit 10 further outputs a write control code STEP<0:5> with a code update period controlled according to the activation period of the first write control signal SET_WDEN. The data write unit 20 supplies a program current I_PRO to a phase-change memory cell 30 in response to the first and second write control signals SET_WDEN and RESET_WDEN, and controls the program current I_PRO according to a code combination of the write control code STEP<0:5> updated periodically during the activation period of the first write control signal SET_WDEN. This embodiment exemplifies a method of outputting four types of program currents according to a data combination of two input data, i.e., a first input data DATA_IN1 and a second input data DATA_IN2.

Hereinafter, a description will be given of the detailed structure and the main operation of the above phase-change memory device.

In the data write control unit 10, the first write control signal SET_WDEN has an activation period controlled according to a data combination of the first input data DATA_IN1 and the second input data DATA_IN2 and the second write control signal RESET_WDEN has a predetermined activation period. That is, because the number of data combinations of two input data is 4, the activation period of the first write control signal SET_WDEN is controlled to control three data combinations and the second write control signal RESET_WDEN with the predetermined activation period is used to control one data combination. Herein, the update period of the write control code STEP<0:5> is controlled according to the activation period of the first write control signals SET_WDEN. That is, the update period of the write control code STEP<0:5> decreases when the activation period of the first write control signal SET_WDEN decreases; and the update period of the write control code STEP<0:5> increases when the activation period of the first write control signal SET_WDEN increases.

The data write unit 20 supplies a program current I_PRO to the phase-change memory cell 30 in response to the first and second write control signals SET_WDEN and RESET_WDEN. The program current I_PRO is supplied during the activation period of the first write control signal SET_WDEN or the second write control signal RESET_WDEN. Herein, the activation period of the second write control signal RESET_WDEN is fixed, but the first write control signal SET_WDEN has three different activation periods according to the data combination of the first and second input data DATA_IN1 and DATA_IN2. Thus, the program current I_PRO is controlled according to a code combination of the write control code STEP<0:5> updated periodically during the activation period of the first write control signal SET_WDEN. That is, when the activation period of the first write control signal SET_WDEN is short, the program current I_PRO decreases rapidly by the rapidly-updated write control code STEP<0:5>; and when the activation period of the first write control signal SET_WDEN is long, the program current I_PRO decreases gradually by the gradually-updated write control code STEP<0:5>.

Figure 4:
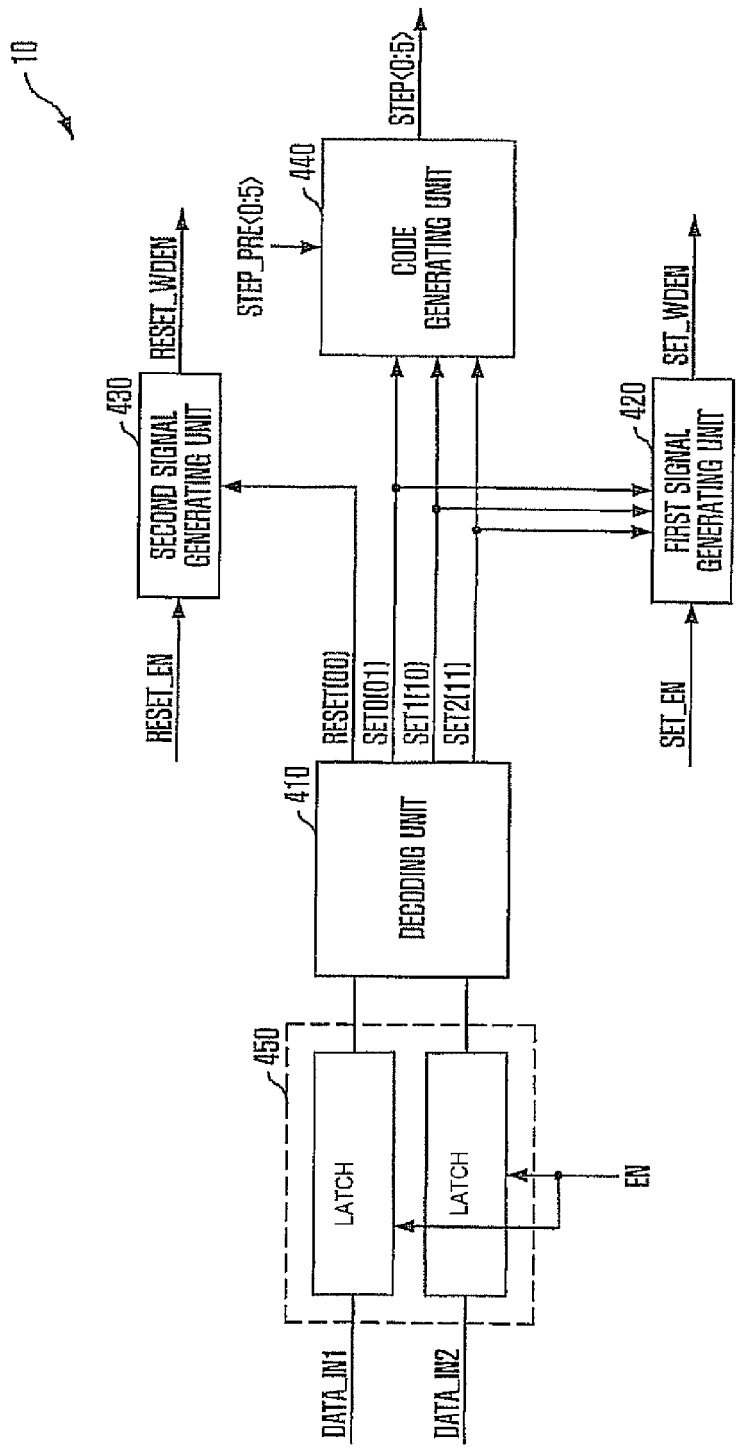
FIG. 4 is a diagram illustrating a structure of a data write control unit in accordance with an exemplary embodiment.

FIG. 4 is a diagram illustrating a structure of the data write control unit 10 in accordance with an exemplary embodiment.

As shown, the data write control unit 10 includes a decoding unit 410, a first signal generating unit 420, a second signal generating unit 430, and a code generating unit 440. The decoding unit 410 outputs a plurality of set data signals SET0, SET1 and SET2 and a reset data signal RESET by decoding the plurality of input data DATA_IN1 and DATA_IN2. The first signal generating unit 420 generates the first write control signal SET_WDEN in response to the set data signals SET0, SET1 and SET2 and a set program signal SET_EN, and controls the activation period of the first write control signal SET_WDEN according to the set data signals SET0, SET1 and SET2. The second signal generating unit 430 generates the second write control signal RESET_WDEN with a predetermined activation period in response to the reset data signal RESET and the reset program signal RESET_EN. The code generating unit 440 generates the write control code STEP<0:5> with a code update period controlled according to the set data signals SET0, SET1 and SET2.

Also, for reference, the data write control unit 10 may further include a latch unit 450 configured to store the input data DATA_IN1 and DATA_IN2 in response to a latch enable signal EN. The latch unit 450 stores the input data DATA_IN1 and DATA_IN2 in response to the latch enable signal EN and outputs the same to the decoding unit 410.

The decoding unit 410 outputs the first to third set data signals SET0, SET1 and SET2, and reset data signal RESET by decoding the input data DATA_IN1 and DATA_IN2 outputted from the latch unit 450.

Also, the first signal generating unit 420 generates the first write control signal SET_WDEN in response to the first to third set data signals SET0, SET1 and SET2 and the set program signal SET_EN. Herein, the activation period of the first write control signal SET_WDEN is controlled according to which of the first to third set data signals SET0, SET1 and SET2 is activated. In this embodiment, when the first set data signal SET0 is activated, the first write control signal SET_WDEN has the shortest activation period. When the third set data signal SET2 is activated, the first write control signal SET_WDEN has the longest activation period. When the second set data signal SET1 is activated, the first write control signal SET_WDEN has the medium activation period. The first set data signal SET0 is activated when the data combination of the input data DATA_IN1 and DATA_IN2 is '01'. The second set data signal SET1 is activated when the data combination of the input data DATA_IN1 and DATA_IN2 is '10'. The third set data signal SET2 is activated when the data combination of the input data DATA_IN1 and DATA_IN2 is '11'.

Also, the second signal generating unit 430 generates the second write control signal RESET_WDEN with the predetermined activation period in response to the reset data signal RESET and the reset program signal RESET_EN. Herein, the reset data signal RESET is activated when the data combination of the input data DATA_IN1 and DATA_IN2 is '00'.

Also, the code generating unit 440 generates the write control code STEP<0:5> with the code update period controlled according to the first to third set data signals SET0, SET1 and SET2. Herein, when the first set data signal SET0 is activated, the write control code STEP<0:5> having the same update period as a basic code STEPPRE<0:5> is generated. When the second set data signal SET1 is activated, the write control code STEP<0:5> having an update period two times longer than the update period of the basic code STEPPRE<0:5> is generated. When the third set data signal SET2 is activated, the write control code STEP<0:5> having an update period four times longer than the update period of the basic code STEPPRE<0:5> is generated. For reference, the write control code STEP<0:5> has an initial value of '111 111' and it is down-counted and outputted every update period.

Figure 5:
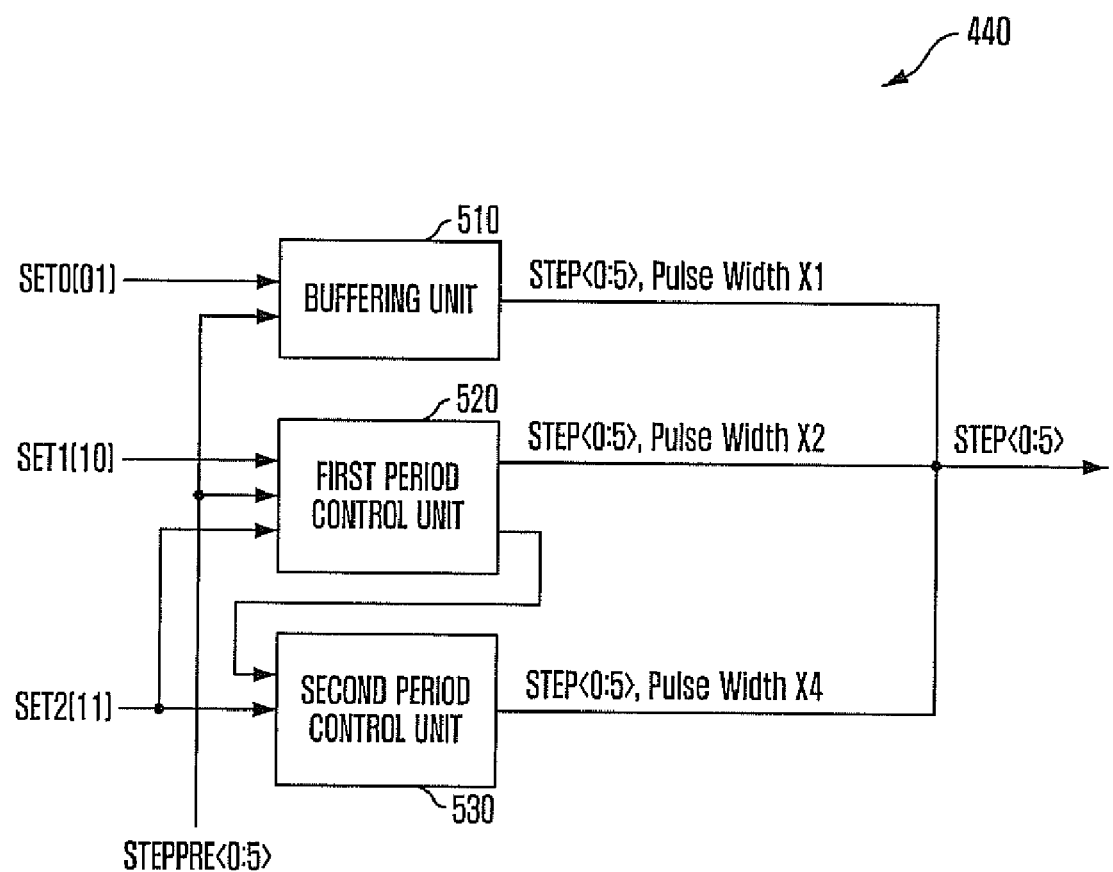
FIG. 5 is a diagram illustrating a structure of a code generator unit in accordance with an exemplary embodiment.

FIG. 5 is a diagram illustrating a structure of the code generating unit 440 in accordance with an exemplary embodiment.

As shown, the code generating unit 440 includes a buffering unit 510, a first period control unit 520, and a second period control unit 530. The buffering unit 510 buffers and outputs the basic code STEPPRE<0:5> in response to the first set data signal SET0 among the set data signals SET0, SET1 and SET2. The first period control unit 520 controls the update period of the basic code STEPPRE<0:5> in response to the second and third set data signals SET1 and SET2 among the set data signals SET0, SET1 and SET2. The second period control unit 530 controls the update period of a code outputted from the first period control unit 520 in response to the second and third set data signals SET1 and SET2. Herein, when the first set data signal SET0 is activated, the buffering unit 510 is enabled to buffer and output the basic code STEPPRE<0:5>. When the second set data signal SET1 is activated, the first period control unit 520 increases the update period of the basic code STEPPRE<0:5> by two times prior to output. When the third set data signal SET2 is activated, the second period control unit 530 increases the update period of a code outputted from the first period control unit 520 by two times prior to output. The basic code STEPPRE<0:5> is generated by a command decoder (not illustrated) and is up-counted or down-counted every predetermined update period.

Figure 6:
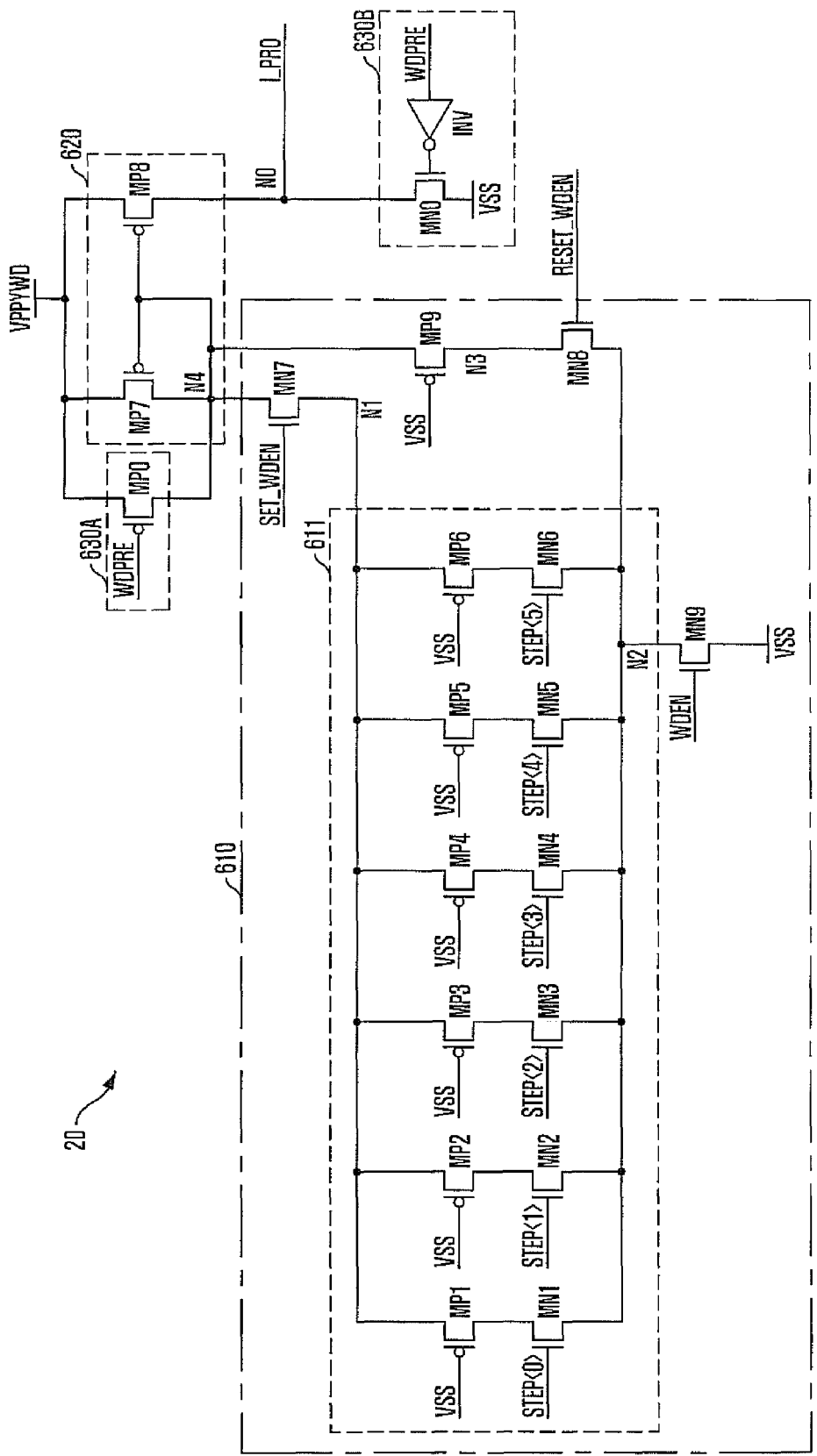
FIG. 6 is a diagram illustrating a structure of a data write unit in accordance with an exemplary embodiment.

FIG. 6 is a diagram illustrating a structure of the data write unit 20 in accordance with an exemplary embodiment.

As shown, the data write unit 20 includes a program current control unit 610 and a program current drive unit 620. The program current control unit 610 controls the voltage level of a control node N4 in response to an enable signal WDEN and the first and second write control signals SET_WDEN and RESET_WDEN. The program current control unit 610 controls the voltage level of the control node N4 according to the code combination of the write control code STEP<0:5> updated periodically during the activation period of the first write control signal SET_WDEN. The program current control unit 610 controls the control node N4 to a predetermined voltage level during the activation period of the second write control signal RESET_WDEN. The program current drive unit 620 outputs the program current I_PRO corresponding to the voltage level of the control node N4.

Also, for reference, the data write unit 209 may further include pre-charge units 630A and 630B configured to pre-charge the control node N4 and an output terminal N0 of the program current in response to a pre-charge signal WDPRE. Herein, the pre-charge units 630A, and 630B include a PMOS transistor MP0, and an inverter INV and an NMOS transistor MN0, respectively. The PMOS transistor MP0 is connected between a power supply VPPYWD and the control node N4 and is controlled by the pre-charge signal WDPRE. The inverter INV inverts the pre-charge signal WDPRE. The NMOS transistor MN0 is connected between a ground VSS and the output terminal N0 of the program current and is controlled by the output signal of the inverter INV. The pre-charge signal WDPRE is pulsed for a given period after the activation period of the first write control signal SET_WDEN and the second write control signal RESET_WDEN. Therefore, the pre-charge signal WDPRE is activated at the supply end point of the program current I_PRO to increase the control node N4 to the level of the power supply VPPYWD and turn off a PMOS transistor MP8, thereby stopping the current driving to the output terminal N0 and pre-charging the output terminal N0 to the level of the ground VSS.

The program current control unit 610 includes NMOS transistors MN7 to MN9, a variable resistor unit 611, and a PMOS transistor MP9. The first NMOS transistor MN7 is connected between the control node N4 and a first node N1 and is controlled by the first write control signal SET_WDEN. The variable resistor unit 611 is connected between the first node N1 and a second node N2 and is controlled by the write control code STEP<0:5>. The PMOS transistor MP9 is connected between the control node N4 and a third node N3 and is controlled by the ground VSS. The second NMOS transistor MN8 is connected between the third node N3 and the second node N2 and is controlled by the second write control signal RESET_WDEN. The third NMOS transistor MN9 is connected between the second node N2 and the ground VSS and is controlled by the enable signal WDEN. Herein, the variable resistor unit 611 includes a plurality of load transistor groups MP1/MN1, MP2/MN2, MP3/MN3, MP4/MN4, MP5/MN5 and MP6/MN6 that are connected in parallel to each other and are controlled by the write control code STEP<0:5> and the ground VSS. Herein, each of the load transistor groups includes a PMOS transistor and an NMOS transistor. Herein, the PMOS transistor is controlled by the ground VSS, and the NMOS transistor is connected to the PMOS transistor and is controlled by the corresponding signal of the write control code STEP<0:5>.

The program current control unit 10 controls the voltage level of the control node N4 in response to the first and second write control signals SET_WDEN and RESET_WDEN. Herein, the number of a plurality of NMOS transistors MN1 to MN6 turned on is determined according to the code combination of the write control code STEP<0:5> updated periodically during the activation period of the first write control signal SET_WDEN to control the voltage level of the control node N4. Also, the second NMOS transistor MN8 is turned on during the activation period of the second write control signal RESET_WDEN to control the voltage level of the control node N4 to a predetermined voltage level.

Also, the program current drive unit 620 includes a plurality of PMOS transistors MP7 and MP8, which are configured to form a current mirror and drive a current corresponding to the voltage level of the control node N4. The first PMOS transistor MP7 is connected between the power supply VPPYWD and the control node N4 and has a gate terminal connected to the control node N4. The second PMOS transistor MP8 is connected between the power supply VPPYWD and the output terminal N0 of the program current and has a gate terminal connected to the control node N4.

The level of the program current I_PRO outputted from the program current drive unit 620 is controlled according to the voltage level of the control node N4 and the channel sizes of the PMOS transistors MP7 and MP8.

Figure 7:
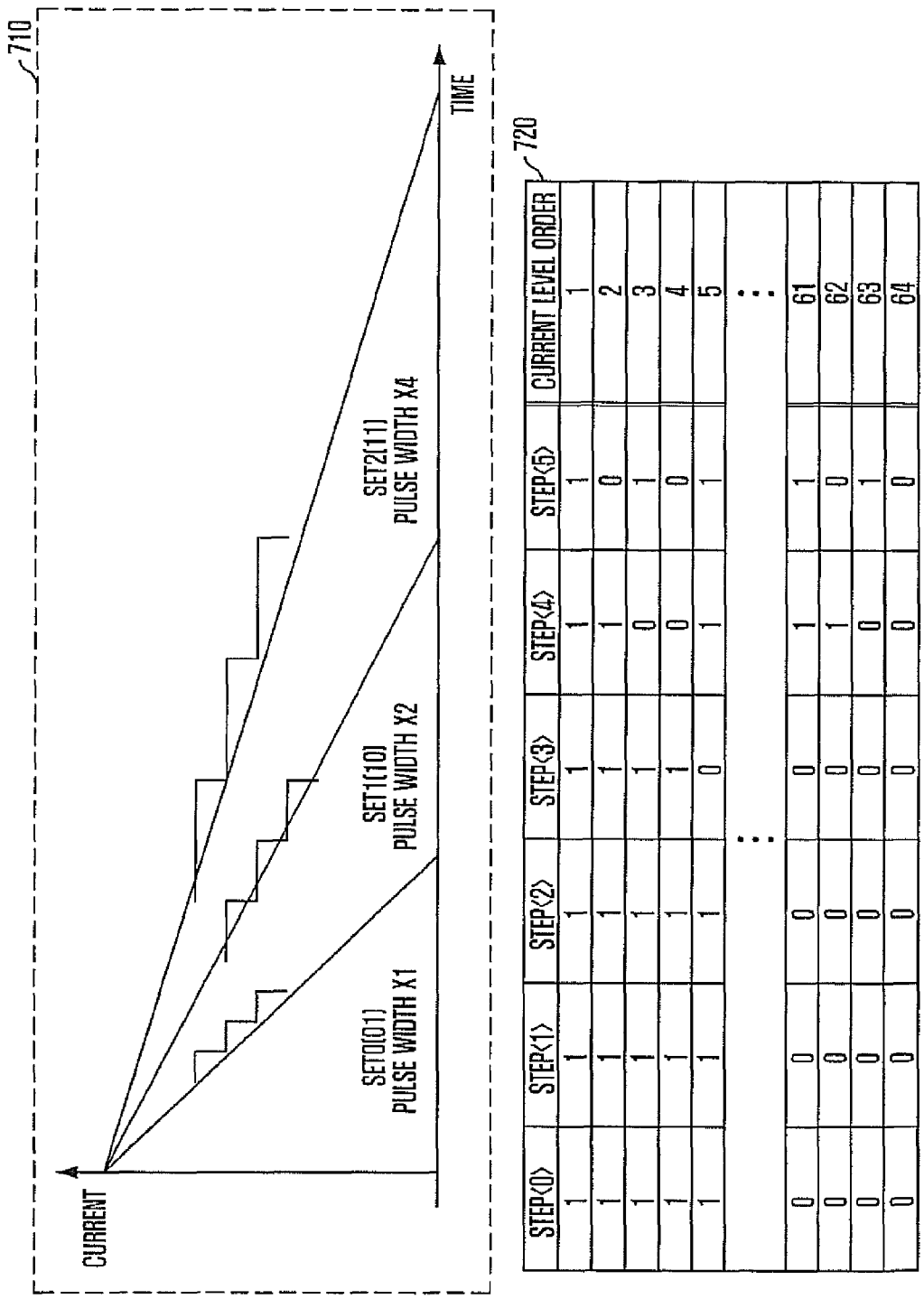
FIG. 7 is a diagram illustrating a program current shape according to a code combination of write control codes.

FIG. 7 is a diagram illustrating a program current shape 710 according to a code combination 720 of write control codes.

Referring to FIG. 7, the write control code STEP<0:5> includes a 6-bit signal and it is down-counted by controlling the code update period according to the set data signals SET0, SET1 and SET2.

When the first set data signal SET0 is activated, the write control code SETP<0:5> is updated at the basic period and the program current is outputted accordingly.

When the second set data signal SET1 is activated, the write control code SETP<0:5> is updated at the period two times longer than the basic period and the program current is outputted accordingly.

When the third set data signal SET2 is activated, the write control code SETP<0:5> is updated at the period four times longer than the basic period and the program current is outputted accordingly.

That is, when the first set data signal SET0 is activated, the program current corresponding to the write control code STEP<0:5> of the shortest update period is outputted for the shortest time. When the third set data signal SET2 is activated, the program current corresponding to the write control code STEP<0:5> of the longest update period is outputted for the longest time.

For reference, because the write control code STEP<0:5> is a binary code form, the corresponding program current is outputted in a gradually-reduced form, i.e., a step pulse form.

As described above, the present invention can vary the phase change characteristics of the MLC-type phase-change memory cell, i.e., a change in a resistance value, by controlling the supply time and level of the program current. In particular, the present invention can control the phase change characteristics of the phase-change memory cell more suitably by controlling the shape of the program current according to a code combination of write control codes that are updated periodically. The above control circuit is simple and low in power consumption.

While the present invention has been described with respect to the specific embodiments, it will be apparent to those skilled in the art that various changes and modifications may be made without departing from the spirit and scope of the invention as defined in the following claims.

For example, the configuration of active high or active low for representing the activation state of a signal and a circuit may vary depending on embodiments. Also, according to circumstances, the structure of the transistor may vary to implement the same function. That is, the structures of the PMOS transistor and the NMOS transistor are interchangeable, which may be implemented using various transistors according to circumstances.

In particular, in order to clearly describe the technical concept of the present invention, the phase-change memory devices in the above-described embodiments have been described as outputting four types of program currents according to a data combination of two input data, i.e., the first input data DATA_IN1 and the second input data DATA_IN2. However, the number of input data combinable may vary depending on the characteristics of the MLC-type phase-change memory cell. The number of modifications from such a circuit is quite numerous and such modifications can be easily made by those skilled in the art; a description of such has been omitted for simplicity.

What is claimed is:

1. A semiconductor memory device comprising:
a memory cell having variable resistance; and
a control unit configured to generate a program current for controlling the resistance of the memory cell to have a multi-level in response to a plurality of input data, wherein the control unit is configured to control a supply time and a level of the program current so that both the supply time and the level of the program current are set differently in response to different combinations of the input data, respectively.

2. The semiconductor memory device of claim 1, wherein the control unit comprises:
a data write control unit configured to generate write control signals according to a data combination of the input data and output write control codes having a code update period controlled according to an activation period of one of the write control signal; and
a data write unit configured to output the program current in response to the write control signals and control the level of the program current according to a code combination of the write control codes.

3. The semiconductor memory device of claim 2, wherein the write control signals include a first write control signal with an activation period controlled according to the data combination and a second write control signal with a predetermined activation period and the write control codes are updated periodically during the activation period of the first write control signal.

4. The semiconductor memory device of claim 3, wherein the data write control unit includes:
a decoding unit configured to output a plurality of set data signals and a reset data signal by decoding the input data;
a first signal generating unit configured to generate the first write control signal in response to the set data signals and a set program signal and control the activation period of the first write control signal according to the set data signals;
a second signal generating unit configured to generate the second write control signal in response to the reset data signal and a reset program signal; and
a code generating unit configured to generate the write control codes having the code update period controlled according to the set data signals.

5. The semiconductor memory device of claim 4, wherein the data write control unit further includes:
a latch unit configured to store the input data in response to a latch enable signal.

6. The semiconductor memory device of claim 4, wherein the code generating unit includes:
a buffering unit configured to buffer and output a basic code in response to a first set data signal among the set data signals;
a first period control unit configured to control an update period of the basic code in response to second and third set data signals among the set data signals; and
a second period control unit configured to control an update period of a code outputted from the first period control unit in response to the second and third set data signals.

7. The semiconductor memory device of claim 6, wherein the basic code is generated by a command decoder and is up-counted or down-counted at every predetermined update period.

8. The semiconductor memory device of claim 3, wherein the data write unit includes:
a program current control unit configured to control a voltage level of a control node according to the code combination in response to an enable signal and the first and second write control signals, and control the voltage level of the control node to a predetermined voltage level during the activation period of the second write control signal; and
a program current drive unit configured to output the program current corresponding to the voltage level of the control node.

9. The semiconductor memory device of claim 8, wherein the data write unit further includes:
a pre-charge unit configured to pre-charge the control node and an output terminal of the program current in response to a pre-charge signal.

10. The semiconductor memory device of claim 9, wherein the pre-charge unit includes:

a first transistor connected between a power source voltage terminal and the control node and controlled by the pre-charge signal;

an inverter configured to invert the pre-charge signal; and a second transistor connected between a ground voltage terminal and the output terminal of the program current and controlled by the output signal of the inverter.

11. The semiconductor memory device of claim 8, wherein the program current control unit includes:

a first transistor connected between the control node and a first node and controlled by the first write control signal;

a variable resistor unit connected between the first node and a second node and controlled by the write control code;

a second transistor connected between the control node and a third node and controlled by a ground voltage;

a third transistor connected between the third node and the second node and controlled by the second write control signal; and a fourth transistor connected between the second node and a ground voltage terminal and controlled by the enable signal.

12. The semiconductor memory device of claim 11, wherein the variable resistor unit includes:

a plurality of load transistor groups that are connected in parallel to each other and are controlled by the write control codes and the ground voltage.

13. The semiconductor memory device of claim 12, wherein each of the load transistor groups includes:

a PMOS transistor controlled by the ground voltage; and an NMOS transistor connected to the PMOS transistor and controlled by the corresponding signal of the write control codes.

14. The semiconductor memory device of claim 8, wherein the program current drive unit includes:

a plurality of transistors that are configured to form a current mirror and drive the program current corresponding to the voltage level of the control node.

15. The semiconductor memory device of claim 8, wherein the program current drive unit includes:

a first transistor connected between a power source voltage terminal and the control node and having a gate terminal connected to the control node; and a second transistor connected between the power source voltage terminal and the output terminal of the program current and having a gate terminal connected to the control node.

\* \* \* \* \*